United States Patent
Mathew et al.

(10) Patent No.: US 7,192,876 B2
(45) Date of Patent: Mar. 20, 2007

(54) TRANSISTOR WITH INDEPENDENT GATE STRUCTURES

(75) Inventors: Leo Mathew, Austin, TX (US); Robert F. Steimle, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 208 days.

(21) Appl. No.: 10/443,375

(22) Filed: May 22, 2003

(65) Prior Publication Data

US 2004/0235300 A1 Nov. 25, 2004

(51) Int. Cl.
H01L 21/308 (2006.01)

(52) U.S. Cl. .............. 438/720; 438/253; 438/396; 438/706

(58) Field of Classification Search ............... 438/706, 438/710, 714, 720, 253, 396, 397, 631, 632, 438/6, 629
See application file for complete search history.

(56) References Cited

U.S. PATENT DOCUMENTS

| | | |
|---|---|---|
| 4,714,519 A | 12/1987 | Pfiester |
| 4,859,623 A | 8/1989 | Busta |
| 4,868,617 A | 9/1989 | Chiao et al. |
| 5,063,172 A | 11/1991 | Manley |
| 5,089,870 A | 2/1992 | Haond |
| 5,212,105 A | 5/1993 | Kizu et al. |
| 5,284,784 A | 2/1994 | Manley |
| 5,324,960 A | 6/1994 | Pfiester et al. |
| 5,631,176 A | 5/1997 | Kapoor |
| 5,631,482 A | 5/1997 | Hong |
| 5,641,698 A | 6/1997 | Lin |
| 5,689,127 A | 11/1997 | Chu et al. |
| 5,804,848 A | 9/1998 | Mukai |
| 5,831,319 A | 11/1998 | Pan |
| 5,912,492 A | 6/1999 | Chang et al. |
| 5,915,176 A | 6/1999 | Lim |

(Continued)

FOREIGN PATENT DOCUMENTS

DE 101 25 967 C1 5/2001

(Continued)

OTHER PUBLICATIONS

Singer et al., "Dual Gate Control Provides Threshold Voltage Options," Semiconductor International, Nov. 1, 2003, 2 pgs.

(Continued)

Primary Examiner—Nadine Norton
Assistant Examiner—Mahmoud Dahimene
(74) Attorney, Agent, or Firm—David G. Dolezal; James L. Clingan, Jr.

(57) ABSTRACT

A method of making a transistor with independent gate structures. The gate structures are each adjacent to sidewalls of a semiconductor structure. The method includes depositing at least one conformal layer that includes a layer of gate material over a semiconductor structure that includes the channel region. A planar layer is formed over the wafer. The planar layer has a top surface below the top surface of the rat least one conformal layer at a location over the substrate. The at least one conformal layers are etched to remove the gate material over the semiconductor structure.

39 Claims, 10 Drawing Sheets

U.S. PATENT DOCUMENTS

| | | | |
|---|---|---|---|
| 6,011,725 A | 1/2000 | Eitan | |
| 6,031,266 A | 2/2000 | Honna | |
| 6,043,545 A | 3/2000 | Tseng et al. | |
| 6,093,612 A | 7/2000 | Suh | |
| 6,097,065 A | 8/2000 | Forbes et al. | |
| 6,150,687 A | 11/2000 | Noble et al. | |
| 6,207,519 B1 | 3/2001 | Kim et al. | |
| 6,300,182 B1 | 10/2001 | Yu | |
| 6,312,995 B1 | 11/2001 | Yu | |
| 6,330,184 B1 | 12/2001 | White et al. | |
| 6,355,961 B1 | 3/2002 | Forbes | |
| 6,372,559 B1 | 4/2002 | Crowder et al. | |
| 6,396,108 B1 | 5/2002 | Krivokapic et al. | |
| 6,399,451 B1 | 6/2002 | Lim et al. | |
| 6,413,802 B1 | 7/2002 | Hu et al. | |
| 6,414,356 B1 | 7/2002 | Forbes et al. | |
| 6,424,001 B1 | 7/2002 | Forbes | |
| 6,433,609 B1 | 8/2002 | Voldman | |
| 6,458,662 B1 | 10/2002 | Yu | |
| 6,472,258 B1 | 10/2002 | Adkisson et al. | |
| 6,531,350 B2 * | 3/2003 | Satoh et al. | 438/197 |
| 6,562,676 B1 | 5/2003 | Ju | |
| 6,563,151 B1 | 5/2003 | Shin et al. | |
| 6,566,208 B2 | 5/2003 | Pan et al. | |
| 6,566,682 B2 | 5/2003 | Forbes | |
| 6,583,469 B1 | 6/2003 | Fried et al. | |
| 6,656,825 B2 | 12/2003 | Burbach | |
| 6,661,057 B1 | 12/2003 | Dawson et al. | |
| 6,689,650 B2 * | 2/2004 | Gambino et al. | 438/157 |
| 6,720,216 B2 | 4/2004 | Forbes | |
| 6,768,158 B2 * | 7/2004 | Lee et al. | 257/315 |
| 6,787,864 B2 * | 9/2004 | Paton et al. | 257/412 |
| 6,816,414 B1 | 11/2004 | Prinz | |
| 6,846,734 B2 * | 1/2005 | Amos et al. | 438/592 |
| 7,005,710 B1 | 2/2006 | Gonzalez et al. | |
| 2003/0034518 A1 | 2/2003 | Yoshikawa | |
| 2003/0038308 A1 | 2/2003 | Kim | |
| 2003/0113970 A1 | 6/2003 | Fried et al. | |
| 2003/0170969 A1 | 9/2003 | Ishida et al. | |
| 2003/0178670 A1 | 9/2003 | Fried | |
| 2003/0183872 A1 | 10/2003 | Milda | |
| 2005/0280103 A1 | 12/2005 | Langdo et al. | |

FOREIGN PATENT DOCUMENTS

WO    WO 00/21118    4/2000

OTHER PUBLICATIONS

Choi et al., "Sub-20 nm CMOS FinFET Technologies," *0-7803-7052-X/01 IEEE*, 2001, 4 pps.

Fossum et al., "Extraordinarily High Drive Currents in Asymmetrical Double-Gate MOSFETs," *Superlattices and Microstructures*, vol. 28, No. 5/6, 2000, pp. 525-530.

Gonzalez, Sr. et al., "A Dynamic Source-Drain Extension (DSDE) MOSFET Using a Separately Biased Conductive Spacer," pp. 645-648.

Kedzierski et al., "High-performance Symmetric-gate and CMOS-compatible $V_t$ Asymmetric-gate FinFET Devices," *0-7803-7052-X/01 IEEE*, 2001, 4 pps.

Kim et al., "Double-Gate CMOS; Symmetrical-Versus Asymmetrical-Gate Devices," *IEEE Transactions on Electron Devices*, vol. 48, No. 2, Feb. 2001, pp. 294-299.

Tanaka et al., "Ultrafast Operation of $V_{th}$-Adjusted $p^+$-$n^+$ Double-Gate SOI MOSFET's," *IEEE Electron Devices Letters*, vol. 15, No. 10, Oct. 1994, pp. 386-388.

Yu et al., "FinFET Scaling to 10 nm Gate Length," *IEDM*, 2002, pp. 251-254.

U.S. Appl. No. 10/074,732 entitled "Method of Forming a Vertical Double Gate Semiconductor Device and Structure Thereof," filed Feb. 13, 2002, assignee same as assignee hereof.

U.S. Appl. No. 10/324,787 entitled "Vertical MOSFET with Astmmetric Gate Structure," filed Dec. 20, 2002, assignee same as assignee hereof.

Chan et al., "A True Single-Transistor Oxide-Nitride-Oxide EEPROM Device," *IEEE Electron Device Letters*, Mar. 1987, pp. 93-95, vol. EDL-8, No. 3.

Hisamoto et al., "FinFET-A Self-Aligned Double-Gate MOSFET Scalable to 20 nm," *IEEE Transactions on Electron Devices*, Dec. 2000, pp. 2320-2325, vol. 47, No. 12.

Lee et al., "Multilevel Vertical-Channel SONOS Nonvolatile Memory on SOI," *IEEE Electron Device Letters*, 2002, pp. 1-3 and 208-209.

* cited by examiner

CONDITIONS FOR BIT 1713

| | $WL_0$ | $WL_1$ | $WL_2$ | $WL_3$ | $BL_0$ | $BL_1$ | $BL_2$ | $BL_3$ |
|---|---|---|---|---|---|---|---|---|
| PROGRAM | $V_{PP}$ | $V_{SS}$ | $V_{SS}$ | $V_{SS}$ | $V_{PP/2}$ | $V_{PP/2}$ | $V_{SS}$ | $V_{SS}$ |
| ERASE | $-V_{PP}$ | $V_{SS}$ | $V_{SS}$ | $V_{SS}$ | $V_{SS}$ | $V_{PP}$ | $V_{SS}$ | $V_{SS}$ |
| READ | $V_{DD}$ | $V_{SS}$ | $V_{SS}$ | $V_{SS}$ | $V_{SS}$ | $S_A$ | $V_{DD}$ | $V_{DD}$ |

*FIG.19*

CONDITIONS FOR BIT 1711

| | $WL_0$ | $WL_1$ | $WL_2$ | $WL_3$ | $BL_0$ | $BL_1$ | $BL_2$ | $BL_3$ |
|---|---|---|---|---|---|---|---|---|
| PROGRAM | $V_{SS}$ | $V_{PP}$ | $V_{SS}$ | $V_{SS}$ | $V_{SS}$ | $V_{SS}$ | $V_{PP/2}$ | $V_{PP/2}$ |
| ERASE | $V_{SS}$ | $-V_{PP}$ | $V_{SS}$ | $V_{SS}$ | $V_{SS}$ | $V_{SS}$ | $V_{PP}$ | $V_{SS}$ |
| READ | $V_{SS}$ | $V_{DD}$ | $V_{SS}$ | $V_{SS}$ | $V_{DD}$ | $V_{DD}$ | $S_A$ | $V_{SS}$ |

*FIG.20*

| | $WL_0$ | $WL_1$ | $WL_2$ | $WL_3$ | $BL_0$ | $BL_1$ | $BL_2$ | $BL_3$ |
|---|---|---|---|---|---|---|---|---|
| PROGRAM | $V_{PP}$ | $-V_{PP}$ | $-V_{PP}$ | $-V_{PP}$ | $-V_{PP/2}$ | $-V_{PP/2}$ | $-V_{PP}$ | $-V_{PP}$ |
| ERASE | $-V_{PP}$ | $V_{SS}$ | $V_{SS}$ | $V_{SS}$ | $V_{SS}$ | $V_{PP}$ | $V_{SS}$ | $V_{SS}$ |
| READ | $V_{DD}$ | $V_{SS}$ | $V_{SS}$ | $V_{SS}$ | $V_{SS}$ | $S_A$ | $V_{DD}$ | $V_{DD}$ |

*FIG.21*

| | $WL_0$ | $WL_1$ | $WL_2$ | $WL_3$ | $BL_0$ | $BL_1$ | $BL_2$ | $BL_3$ |
|---|---|---|---|---|---|---|---|---|
| PROGRAM | $-V_{PP}$ | $V_{PP}$ | $V_{PP}$ | $V_{PP}$ | $-V_{PP}$ | $-V_{PP}$ | $-V_{PP/2}$ | $-V_{PP/2}$ |
| ERASE | $V_{SS}$ | $-V_{PP}$ | $V_{SS}$ | $V_{SS}$ | $V_{SS}$ | $V_{SS}$ | $V_{PP}$ | $V_{SS}$ |
| READ | $V_{SS}$ | $V_{DD}$ | $V_{SS}$ | $V_{SS}$ | $V_{DD}$ | $V_{DD}$ | $S_A$ | $V_{SS}$ |

*FIG.22*

TRANSISTOR WITH INDEPENDENT GATE STRUCTURES

BACKGROUND OF THE INVENTION

Related Applications

This application is related to U.S. Pat. No. 6,903,967 entitled "Memory With Charge Storage Locations and Adjacent Gate Structures," having inventors Leo Mathew, Robert F. Steimle, and Ramachandran Muralidhar, having an assignee of Freescale Semiconductor, Inc., and having a filing date of May 22, 2003, which is hereby incorporated by reference in its entirety.

1. Field of the Invention

This invention relates in general to a transistor and specifically to a method of making a transistor with independent gate structures.

2. Description of the Related Art

Transistors with gate structures adjacent to sidewalls of a channel region are used to implement circuitry in semiconductor devices. One example of such a transistor is a FinFET transistor. Typically, a FinFET transistor includes a channel region located in a "fin" structure that extends perpendicular to the substrate and a gate structure that includes vertical gate components located along the sides of the channel of the fin structure. In some embodiments, the channel region extends between an upward extending source region and drain region. An example of a FinFET is shown in U.S. Pat. No. 6,413,802.

It may be desirable for a semiconductor device to implement a transistor with independent gate structures located adjacent to each sidewall of a channel region. However, manufacturing such a transistor may difficult. For example, FIG. 2B of U.S. Pat. No. 6,433,609 shows a FinFET with independent gate structures. However, this patent sets forth a method that may be difficult to make due to alignment problems in splitting a gate structure on top of the fin structure.

What is desirable is an improved method for making a transistor with independent gate structures.

BRIEF DESCRIPTION OF THE DRAWINGS

The present invention may be better understood, and its numerous objects, features, and advantages made apparent to those skilled in the art by referencing the accompanying drawings.

FIG. 19 sets forth a table of one embodiment of a set of voltages applied to bitlines and word lines of a memory array for programming, erasing, and reading a charge storage location of the memory array according to the present invention.

FIG. 20 sets forth a table of one embodiment of a set of voltages applied to bitlines and word lines of a memory array for programming, erasing, and reading another charge storage location of the memory array according to the present invention.

FIG. 21 sets forth a table of another embodiment of a set of voltages applied to bitlines and word lines of another memory array for programming, erasing, and reading a charge storage location of the memory array according to the present invention.

FIG. 22 sets forth a table of another embodiment of a set of voltages applied to bitlines and word lines of another memory array for programming, erasing, and reading another charge storage location of the memory array according to the present invention.

DETAILED DESCRIPTION

The following sets forth a detailed description of a mode for carrying out the invention. The description is intended to be illustrative of the invention and should not be taken to be limiting.

Figure 1:
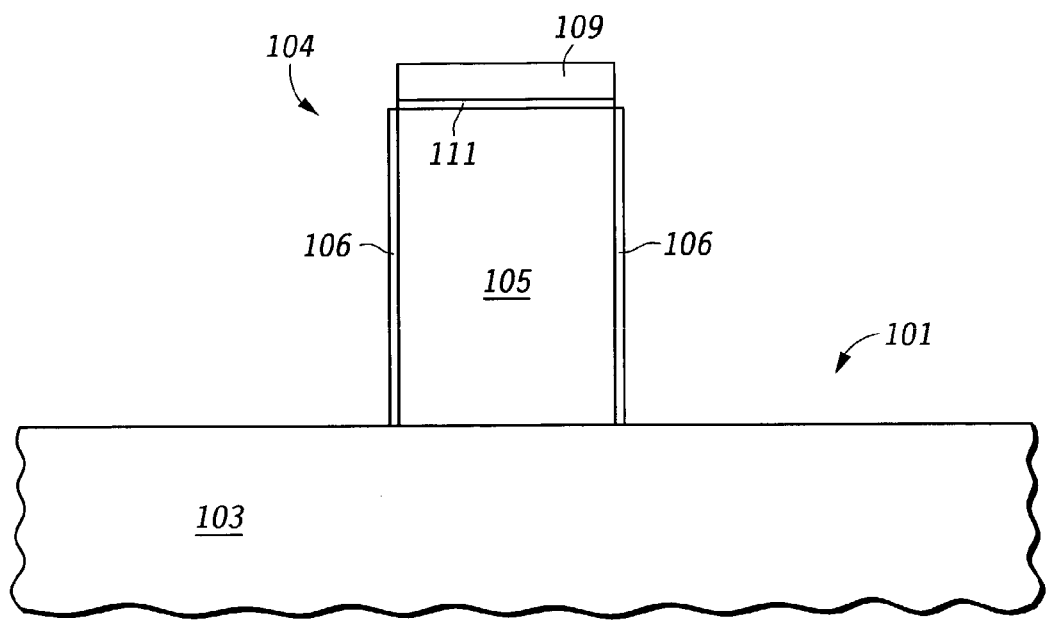
FIG. 1 is a partial side cross sectional view of one embodiment of a semiconductor wafer during a stage in the manufacture of a transistor according to the present invention.

FIG. 1 shows a partial side cross sectional view of one embodiment of a semiconductor wafer during a stage in the manufacture of a transistor with independent gate structures according to the present invention. Wafer 101 includes a substrate with an insulating layer 103. A structure 104 has been formed over insulating layer 103. Structure 104 includes a semiconductor structure portion 105 formed over insulating layer 103, a dielectric portion 111 (e.g. silicon dioxide) formed over semiconductor structure portion 105 and layer 103, and a nitride portion 109 located over portion 111 and portion 105. In one embodiment, structure 104 is formed by depositing a layer of semiconductor material over layer 103, forming a dielectric layer over the semiconductor layer (e.g. by thermal oxidation of the semiconductor layer or by atomic layer deposition of a high K dielectric), and then depositing a layer of nitride over the dielectric. The semiconductor layer, the dielectric layer, and the nitride layer are then patterned to form structure 104. Afterwards, a dielectric layer 106 is formed on the sidewalls of semiconductor structure portion 105. As will be shown later, a channel region and current terminal regions of a transistor are formed in semiconductor structure portion 105 of structure 104. In one embodiment, semiconductor structure portion 105 is made of epitaxial silicon bonded on insulating layer 103. In other embodiments, portion 105 may be made of polysilicon or other semiconductor material. In one embodiment, structure 104 is a fin structure of a FinFET. In other embodiments, portion 109 may be made of other materials (e.g. other dielectrics) that can be utilized as a hard etch mask.

Figure 2:
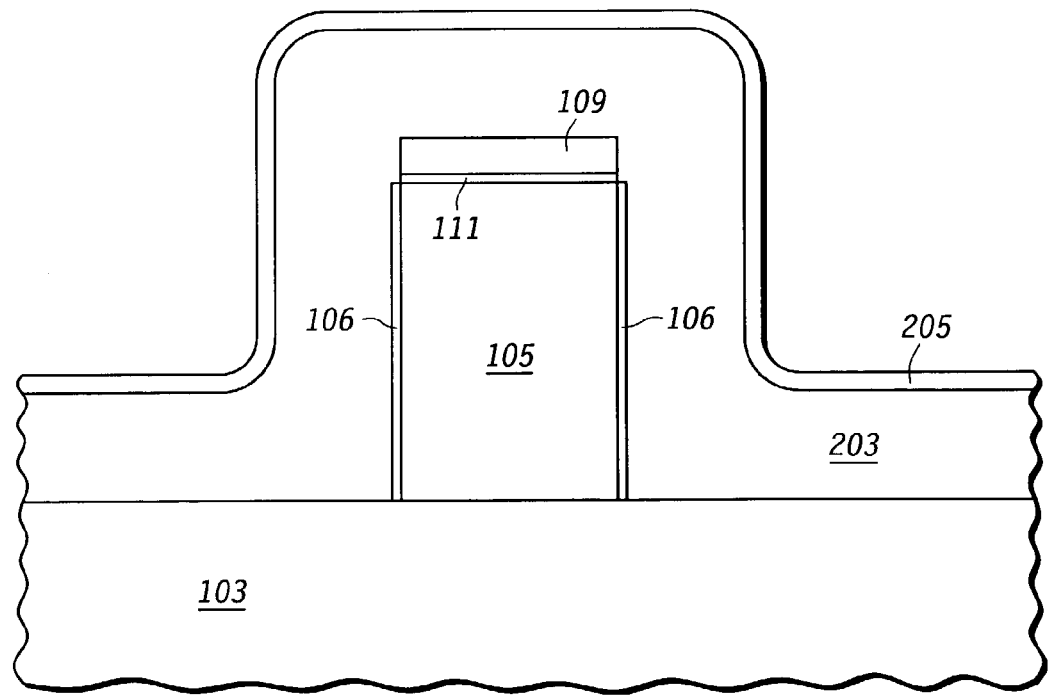
FIG. 2 is a partial side cross sectional view of one embodiment of a semiconductor wafer during another stage in the manufacture of a transistor according to the present invention.

Referring to FIG. 2, a conformal polysilicon layer 203 is deposited over wafer 101 including over structure 104. As will be shown later, polysilicon layer 203 is utilized to form independent gate structures of a FinFET transistor. In other embodiments, layer 203 may be made of other gate materials such as e.g. tungsten, titanium, tantalum silicon nitride, silicides such as cobalt or nickel silicides, germanium, silicon germanium, other metals, or combinations thereof. In the embodiment shown, a conformal nitride layer 205 is then deposited over layer 203. In one embodiment, layer 205 is used both as an antireflective coating and as a hard mask for etching layer 203. Layer 205 may not be included in some embodiments. In some embodiments, layer 203 may be doped prior to the deposition of layer 205. In these embodiments, layer 205 may be doped with single or multiple implants at various energies, angles, and/or species. For example, in one embodiment, the left side of layer 203, relative to the view shown in FIG. 2, may doped with a first dopant at a first angle to provide that portion with a first conductivity type, and the right side of the layer 203, relative to the view shown in FIG. 2 may be doped at a second angle relative to the view shown in FIG. 2 to provide that portion with a second conductivity type.

Figure 3:
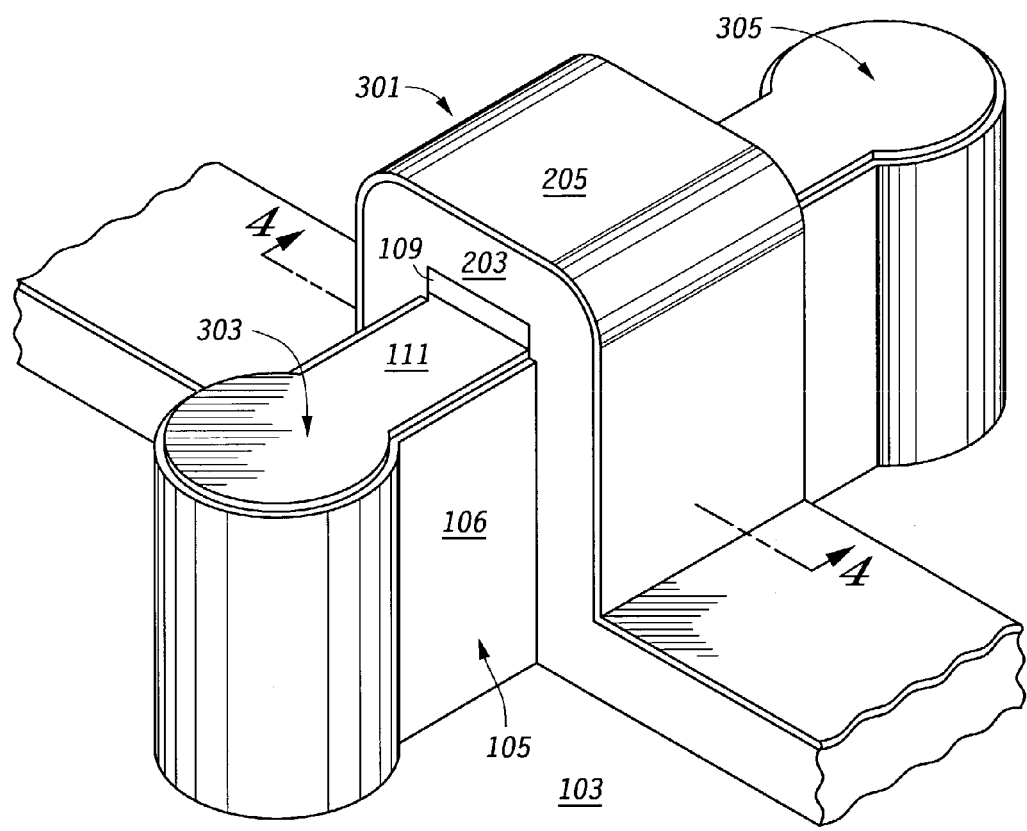
FIG. 3 is a partial isometric view of one embodiment of a semiconductor wafer during another stage in the manufacture of a transistor according to the present invention.

FIG. 3 is a partial isometric view of wafer 101 after layers 205 and 203 have been patterned to form gate structure 301. In some embodiments, layers 205 and 203 are patterned by the utilization of conventional photolithographic techniques. During the patterning, the portion of nitride portion 109 located over structure 104 but not located under gate structure 301 is removed. In other embodiments, this portion of nitride portion 109 may be removed at a later stage during manufacture.

Structure 104 includes current terminal regions 303 and 305 located in each end of portion 105 of structure 104. In one embodiment where the resultant transistor structure is a field effect transistor (FET), regions 303 and 305 serve as the source and drain regions, respectively. Regions 303 and 305 may be doped at this time by e.g. ion implantation or plasma doping.

Figure 4:
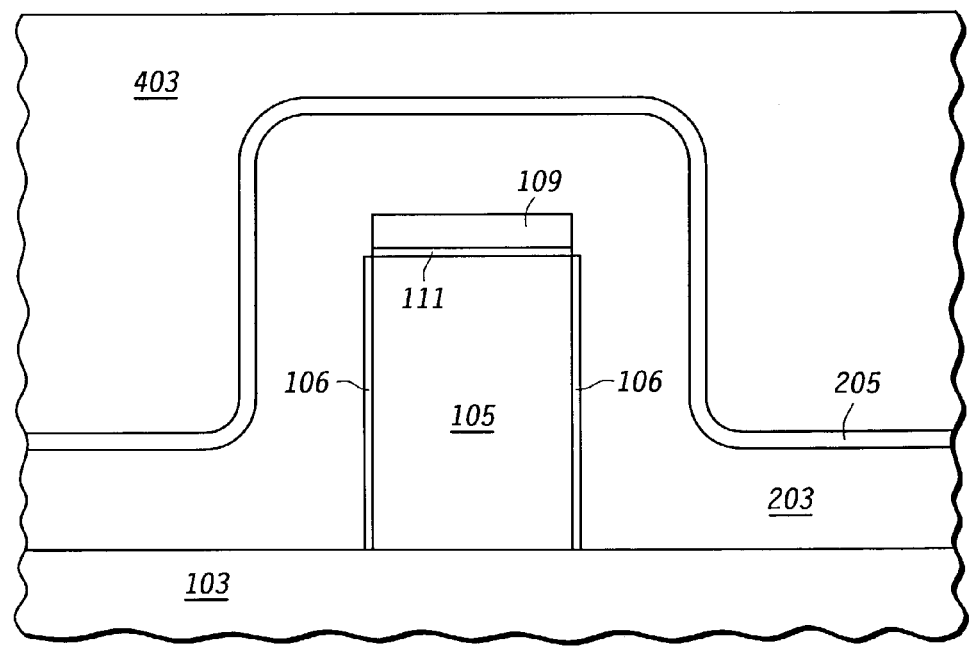
FIG. 4 is a partial side cross sectional view of one embodiment of a semiconductor wafer during another stage in the manufacture of a transistor according to the present invention.

FIG. 4 shows a partial cross sectional view of wafer 101 after a deposition of a planar layer 403 over wafer 101. In some embodiments, layer 403 may be made of e.g., photo resist, spin on glass, or organic antireflective coating material. Layer 403 may be formed by spin on techniques or by chemical vapor deposition techniques followed by chemical mechanical polish or reflow.

Figure 5:
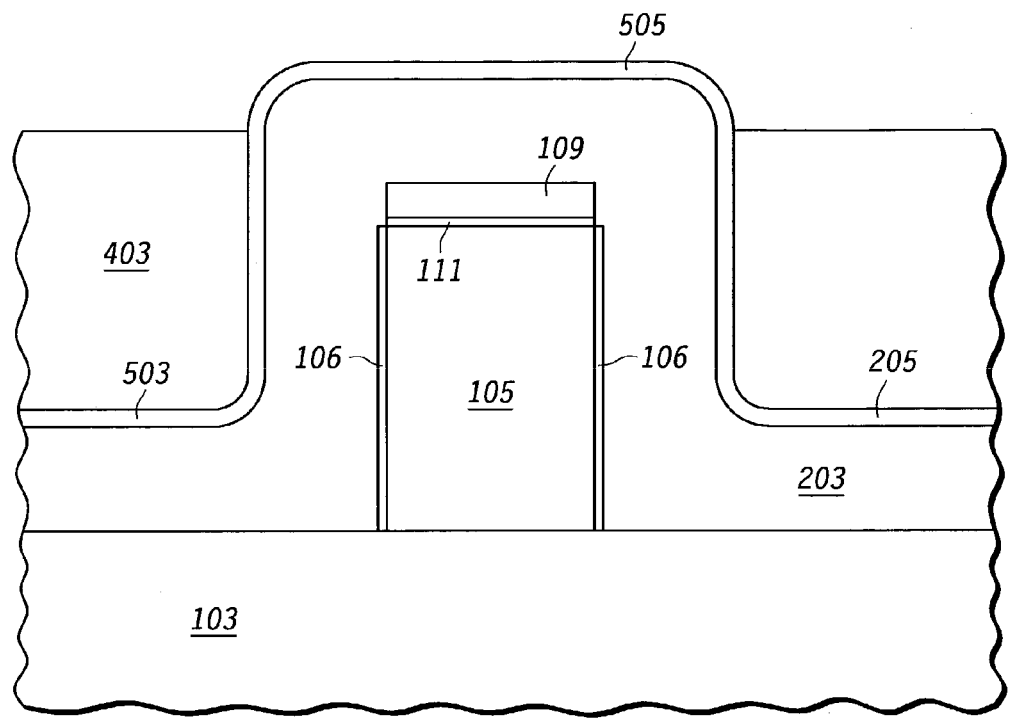
FIG. 5 is a partial side cross sectional view of one embodiment of a semiconductor wafer during another stage in the manufacture of a transistor according to the present invention.

FIG. 5 shows wafer 101 after layer 403 has been etched back to a level below the top of portion 505 of nitride layer 203 located over structure 104 to expose portion 505. In one embodiment, layer 403 may be etched back, e.g., by a conventional dry or wet etch techniques. In the embodiment shown, after the etch back, layer 403 is at least thick enough to cover portion 503 of layer 205 such that portion 505 of layer 205 may be removed by etching without removing portion 503.

In other embodiments, the resultant structure of layer 403 as shown in FIG. 5 may be formed by the planar deposition of the material of layer 403 to the level shown in FIG. 5, or other desired level.

Figure 6:
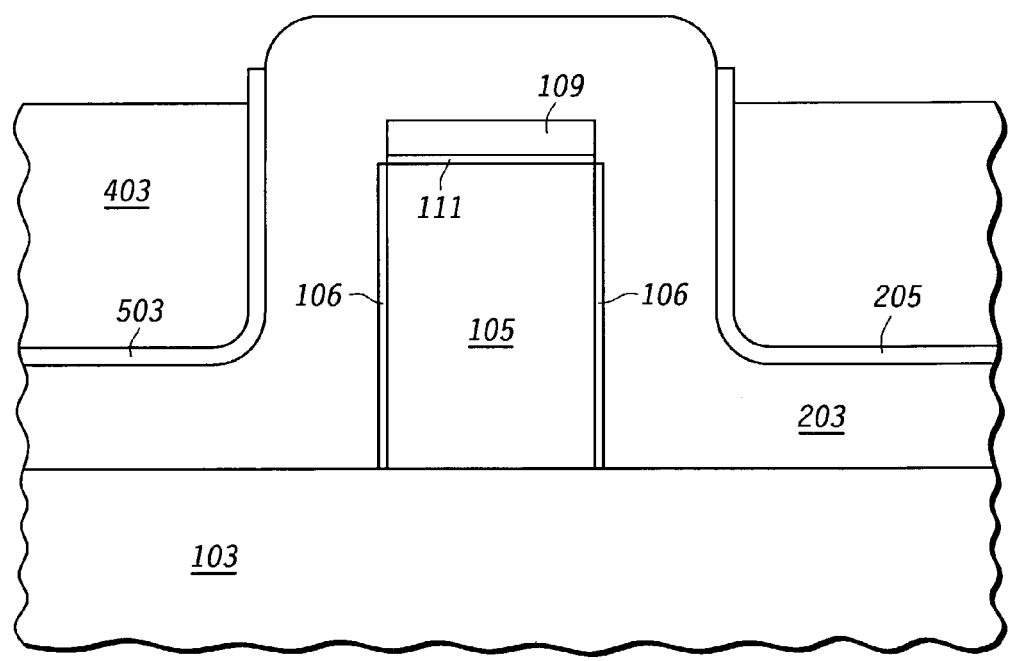
FIG. 6 is a partial side cross sectional view of one embodiment of a semiconductor wafer during another stage in the manufacture of a transistor according to the present invention.

FIG. 6 shows the same view as FIG. 5 after portion 505 of nitride layer 205 located over structure 104 has been removed by etching. Layer 403, as shown in FIG. 6, protects portion 503 of layer 205 from being removing during the etching of portion 505.

Figure 7:
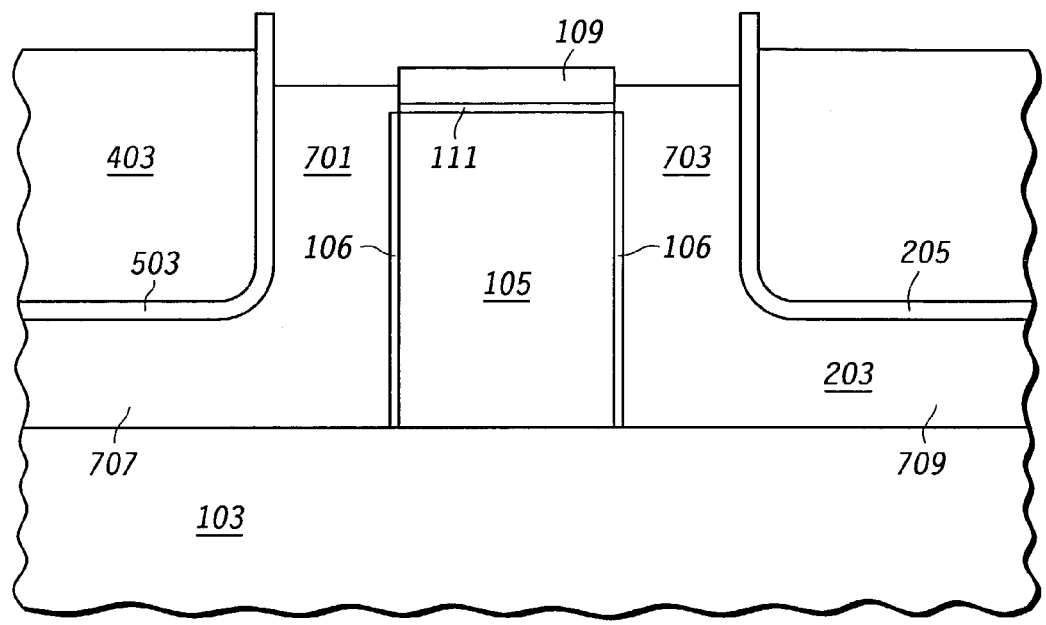
FIG. 7 is a partial side cross sectional view of one embodiment of a semiconductor wafer during another stage in the manufacture of a transistor according to the present invention.

Referring to FIG. 7, after portion 505 of layer 205 has been removed, the portion of layer 203 previously located under removed portion 505 of layer 205 is removed by a non abrasive etching (e.g. wet or dry) to form independent gate structures 701 and 703. Layer 403 (along with the remaining portions of layer 205) protects portions 707 and 709 of layer 203 from being removed during the etching of layer 203. Gate structures 701 and 703 each have a vertical portion located along a sidewall of structure 104.

Utilizing a planar layer for the formation of independent gate structures may allow a portion of the gate material to be removed to form separate gate structures for a transistor without extra masking steps. In some embodiments, the planar layer allows for the portion of the gate structure located over structure 104 to be removed without removing the portions of the gate structure used to form the independent gate structures. In some embodiments, because portions of the conformal layers including the gate material located over structure 104 are exposed from the planar layer, those portions can be removed e.g. by etching to isolate the gate structures without use of an extra mask step. Accordingly, alignment problems in forming separate gate previously described may be avoided.

Figure 8:
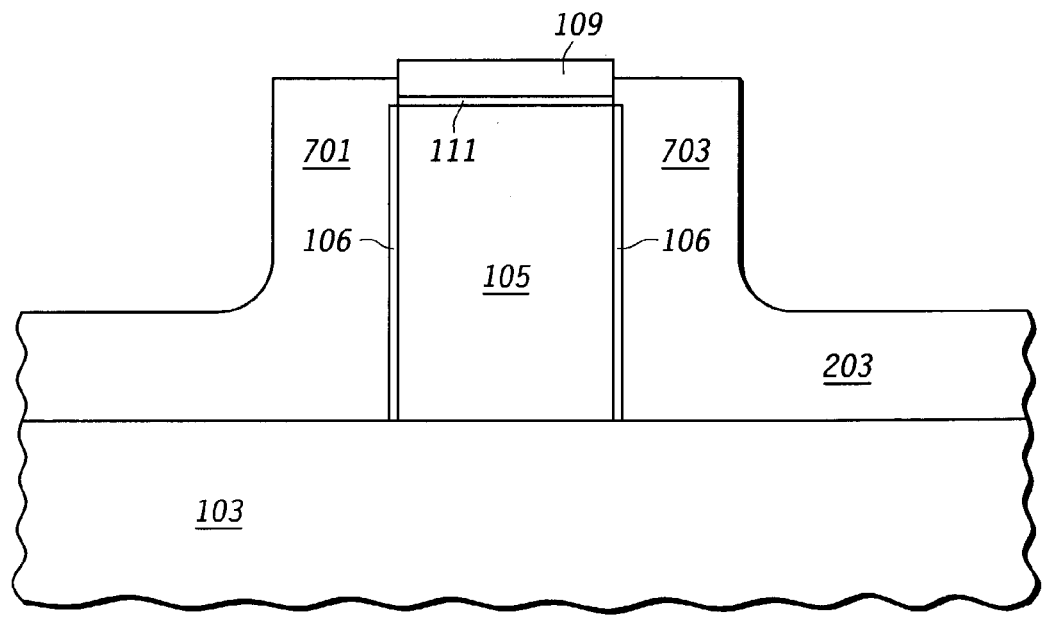
FIG. 8 is a partial side cross sectional view of one embodiment of a semiconductor wafer during another stage in the manufacture of a transistor according to the present invention.

FIG. 8 shows the same view as FIG. 7 after the removal of the remaining portions of layers 403 and 205. In some embodiments, these layers may be removed by wet or dry etches. In other embodiments, the remaining portions of layers 403 and 205 are not removed.

Figure 9:
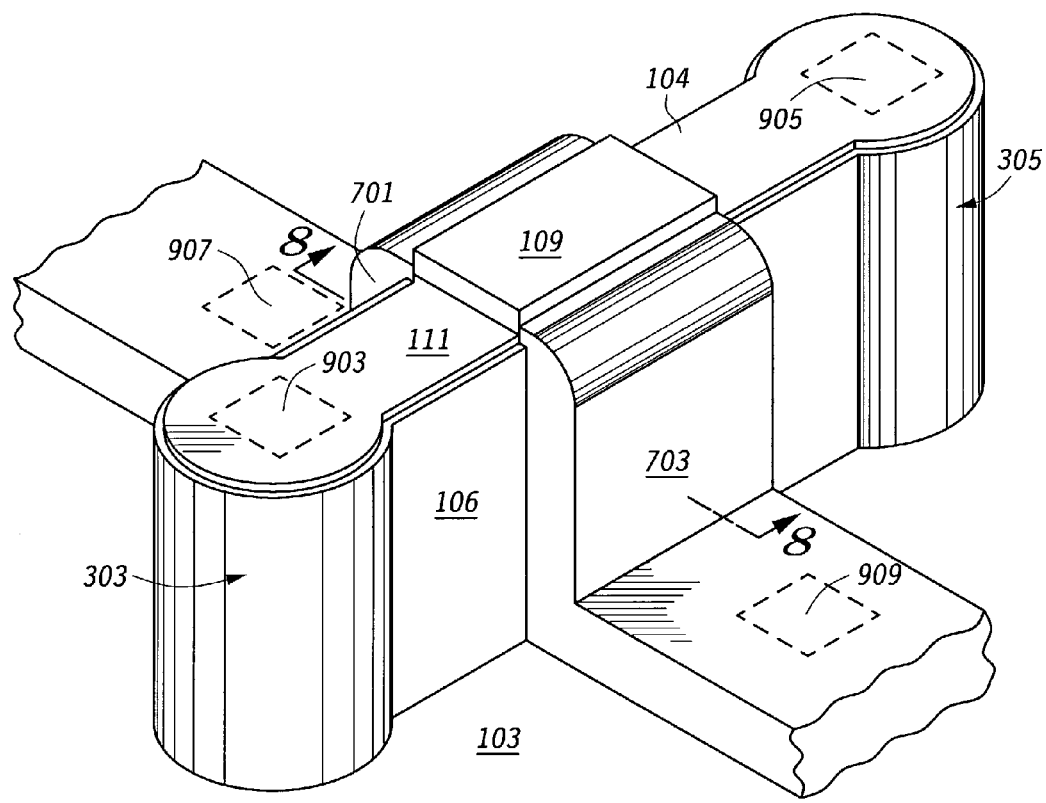
FIG. 9 is a partial isometric view of one embodiment of a semiconductor wafer during another stage in the manufacture of a transistor according to the present invention.

FIG. 9 shows an isometric view of the transistor shown in FIG. 8. In later processing stages, spacers and silicide layers of the transistor are formed by conventional semiconductor techniques. Regions 903 and 905 serve as-current terminal contacts (e.g. as source/drain contacts for FETs). Also, regions 907 and 909 serve as gate contacts for gate structures 701 and 703, respectively.

Figure 10:
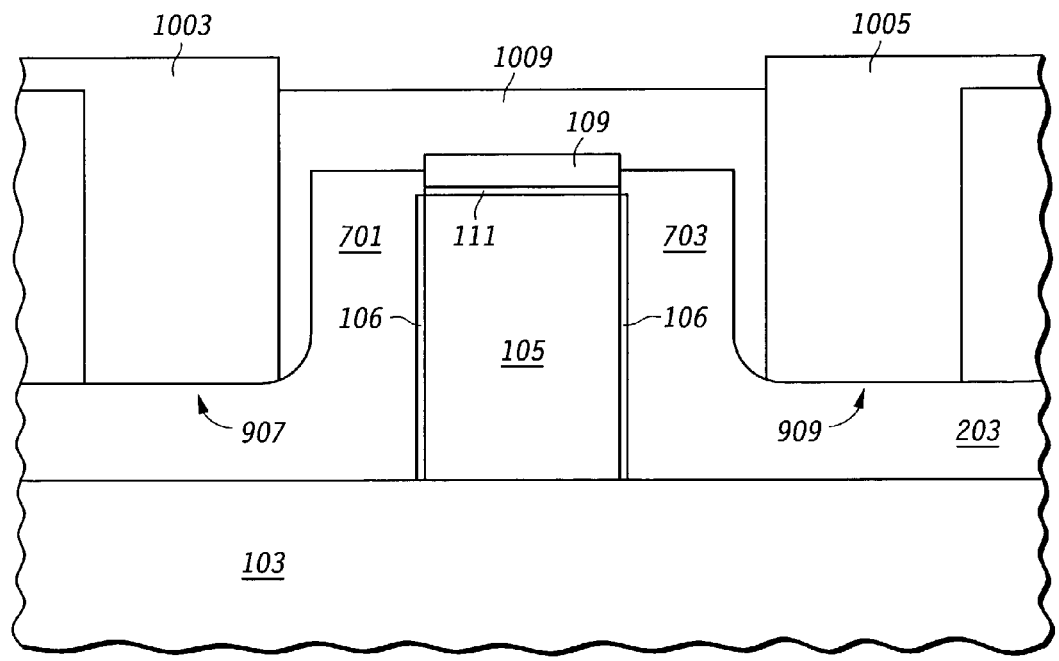
FIG. 10 is a partial side cross sectional view of one embodiment of a semiconductor wafer during another stage in the manufacture of a transistor according to the present invention.

FIG. 10 shows the same view as FIG. 8 after the formation of gate vias 1003 and 1005 over regions 907 and 909, respectively. A low K dielectric material 1009 is shown deposited over the resultant transistor structure. Other conventional processing stages not shown or described herein may be performed on wafer 101 to form other conventional structures (such as e.g. interconnects and passivation layers) of a semiconductor device. Afterwards, the wafer is singulated to separate the integrated circuits of the wafer.

Transistors with independent gate structures according to the present invention may be made by other processes. For example, the formation of the planar layer 403 and the removal of the portion of gate material (e.g. in layer 203) located over structure 104 may be performed after the formation of spacers and/or silicides as described above with respect to FIG. 10. Also, transistors with independent gate structures maybe made with out utilizing conformal nitride layer 205. With these embodiments, the planar layer 403 would be formed such that the top portion of the layer of gate material (e.g. 203) located over structure 104 would be exposed for etching.

In some embodiments, independent gate structures may be coupled together either by hardwiring (e.g. conductive material extending between the gate structures) or by other transistors which would allow for the gate structures to be selectively coupled together.

FIGS. 11–17 set forth views of a semiconductor wafer during various stages in the manufacture of another embodiment of a transistor with independent gate structures according to the present invention. The transistor formed also includes charge storage locations located between the gates and the channel region of the transistor. As will be describe later, such a transistor may be utilized as a non volatile memory device for storing data in the charge storage locations.

Figure 11:
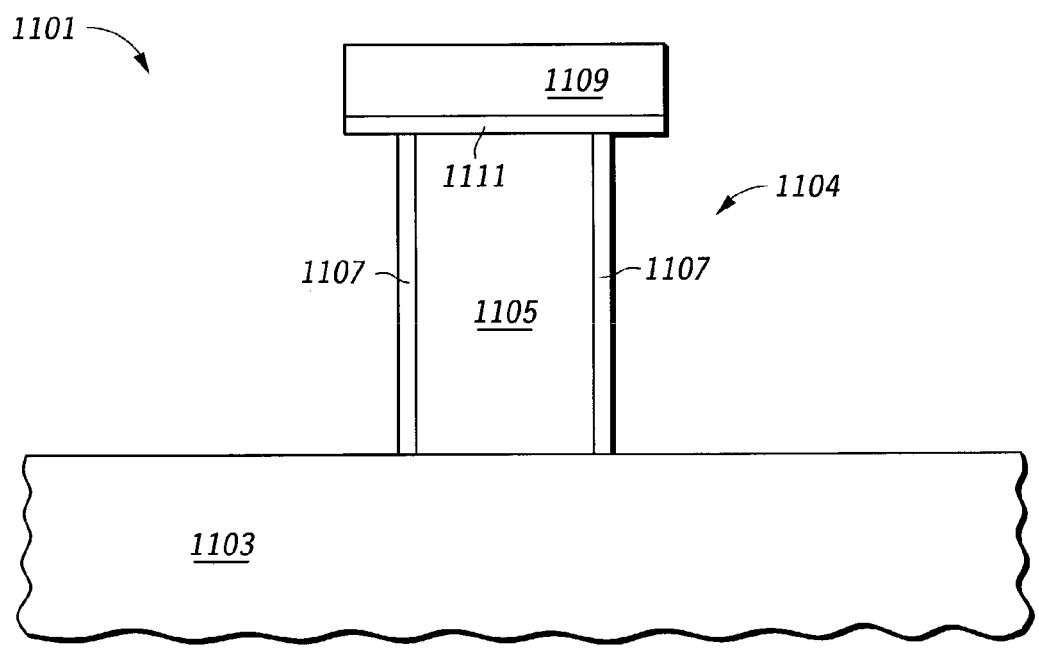
FIG. 11 is a partial side cross sectional view of another embodiment of a semiconductor wafer during a stage in the manufacture of a transistor according to the present invention.

Wafer 1101 includes a substrate having an insulating layer 1103. A structure 1104 has been formed over insulating layer 1103. In one embodiment, structure 1104 is a "fin" structure for a FinFET transistor having charge storage locations. Structure 1104 includes a semiconductor structure portion 1105 formed over the insulating layer 1103, a dielectric portion 1111 (e.g. silicon dioxide) formed over semiconductor structure portion 1105 and layer 1103, and a nitride portion 1109 located over portion 1111 and portion 1105. In one embodiment, structure 1104 is formed by depositing a layer of semiconductor material over layer 1103, forming a dielectric layer over the semiconductor material layer (e.g. by thermal oxidation of the semiconductor layer or by atomic layer deposition of a high K dielectric), and then depositing a layer of nitride over the dielectric. The semiconductor layer, the dielectric layer, and the nitride layer are then patterned to form a structure wherein the sidewalls of the semiconductor layer, the dielectric portion 1111, and nitride portion 1109 are flush with each other. In the embodiment shown, the remaining portion of the semiconductor layer is then trimmed (e.g. with a dry etch having an isotropic component) to recess the sidewalls of remaining semiconductor layer to form portion 1105 as shown in FIG. 11. In other embodiments, structure portion 1105 is not trimmed. In some embodiments, structure portion 1105 may be doped prior to the patterning of the layer of semiconductor material by conventional semiconductor processing techniques to provide the channel region of portion 105 with a specific conductivity type.

Afterwards, a dielectric layer 1107 is formed on the sidewalls of semiconductor structure portion 1105. As will be shown later, the channel region and current terminal regions are formed in portion 1105. In one embodiment, semiconductor structure portion 1105 is made of epitaxial silicon bonded on insulating layer 1103. In other embodiments, portion 1105 may be made of polysilicon or other semiconductor material. In one embodiment, structure 1104 is a fin structure of a FinFET.

Figure 12:
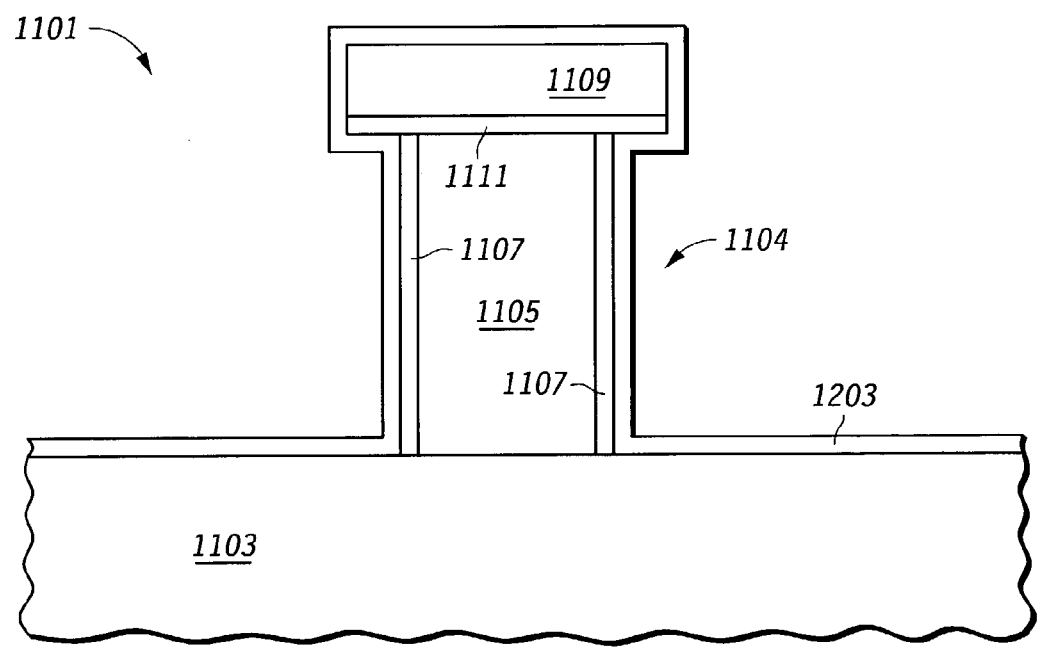
FIG. 12 is a partial side cross sectional view of another embodiment of a semiconductor wafer during another stage in the manufacture of a transistor according to the present invention.

Referring to FIG. 12, a layer 1203 of charge storage material is then deposited over wafer 1101 including structure 1104. In one embodiment, layer 1203 includes a layer of conductive material such as polysilicon (e.g. as with a floating gate transistor). In other embodiments, layer 1203 may include other types of charge storage material including material having a plurality of charge trapping elements (e.g. silicon nitride as with a thin film transistor). Still in other embodiments, layer 1203 may include discrete charge storage material (e.g. silicon nanocrystals embedded in a layer of dielectric). In some embodiments, the nanocrystals are 2–10 nm in diameter and have a density of $3-10e^{11}/cm^2$. In other embodiments, layer 1203 may be made of multiple layers such as e.g. a layer of silicon nanocrystals and a layer of silicon nitride deposited over the layer of silicon nanocrystals or a layer of silicon nanocrystals embedded between two layers of dielectric material.

Figure 13:
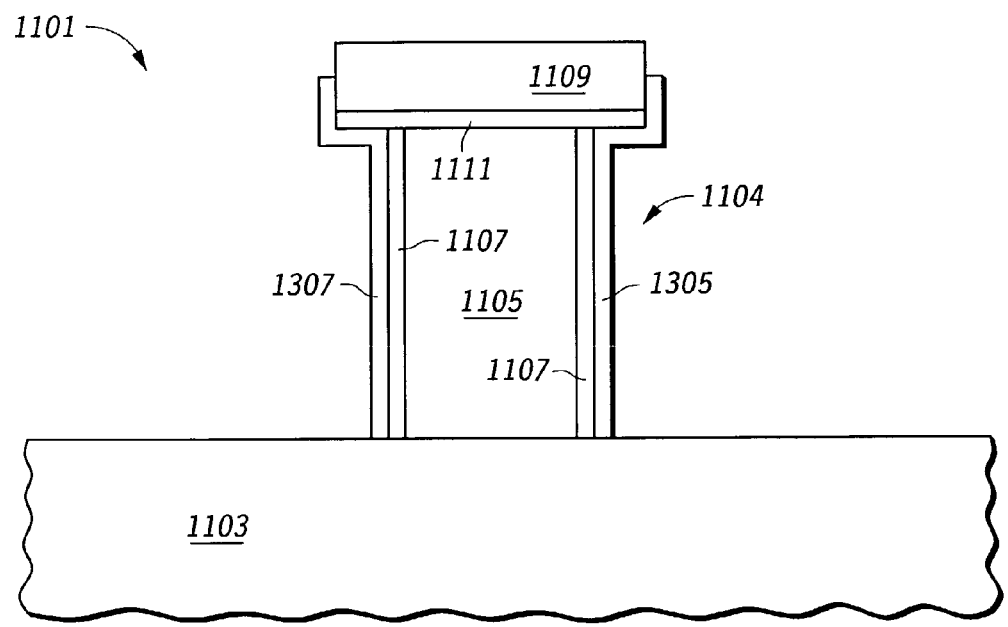
FIG. 13 is a partial side cross sectional view of another embodiment of a semiconductor wafer during another stage in the manufacture of a transistor according to the present invention.

FIG. 13 shows a partial cross sectional view of wafer 1101 after layer 1203 has been etched to remove the portion of layer 1203 located over nitride portion 1109 and located on insulating layer 1103. Portions of layer 1203 remaining will later be etched to form isolated charge storages structures 1307 and 1305 located on the opposite sidewalls of structure 1104. In one embodiment, layer 1203 is etched with anisotropic dry etch to form storage structures 1307 and 1305. In some embodiments, where the charge storage material is made of a high resistivity material such that there would be little to no leakage current, layer 1203 is not etched. In such embodiments, the charge storage structures having charge storage locations would be part of a contiguous layer 1203.

Figure 14:
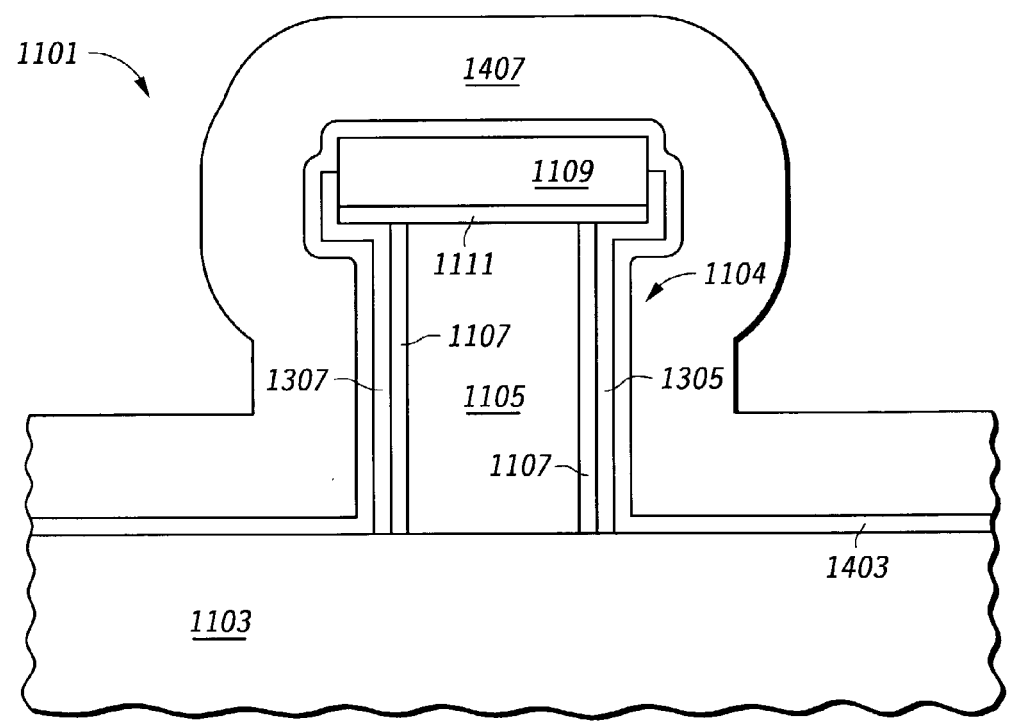
FIG. 14 is a partial side cross sectional view of another embodiment of a semiconductor wafer during another stage in the manufacture of a transistor according to the present invention.

FIG. 14 shows a partial cross sectional view of wafer 1101 after a conformal layer 1403 of control dielectric has been deposited over wafer 1101 and after a conformal layer 1407 of gate material has been deposited over layer 1403.

After the deposition of gate material layer 1407, the wafer is further processed to form to two gate structures as per a similar process describe above with respect to FIGS. 2–8. For example, a nitride layer (not shown), similar to nitride layer 205 in FIG. 2, is deposited over layer 1407. The nitride layer and layer 1407 is then patterned to form a gate structure similar to gate structure 301 shown in FIG. 3. In some embodiments, a portion of charge storage layer 1203 located on the side of dielectric layer 1107 and not underneath the gate structure is etched after the layer 1407 has been etched. After the formation of a gate structure, a planar layer (similar to layer 403 in FIG. 5) is formed wherein the portion of the nitride layer located above structure 1104 is exposed (See FIG. 5 and the text discussing thereof). After the removal of the exposed portion of the nitride layer, the gate material located above structure 1104 is then etched to form gate structures 1505 and 1503 (See FIG. 15) in a manner similar to that set forth in FIGS. 6–8 and the discussion thereof.

Figure 15:
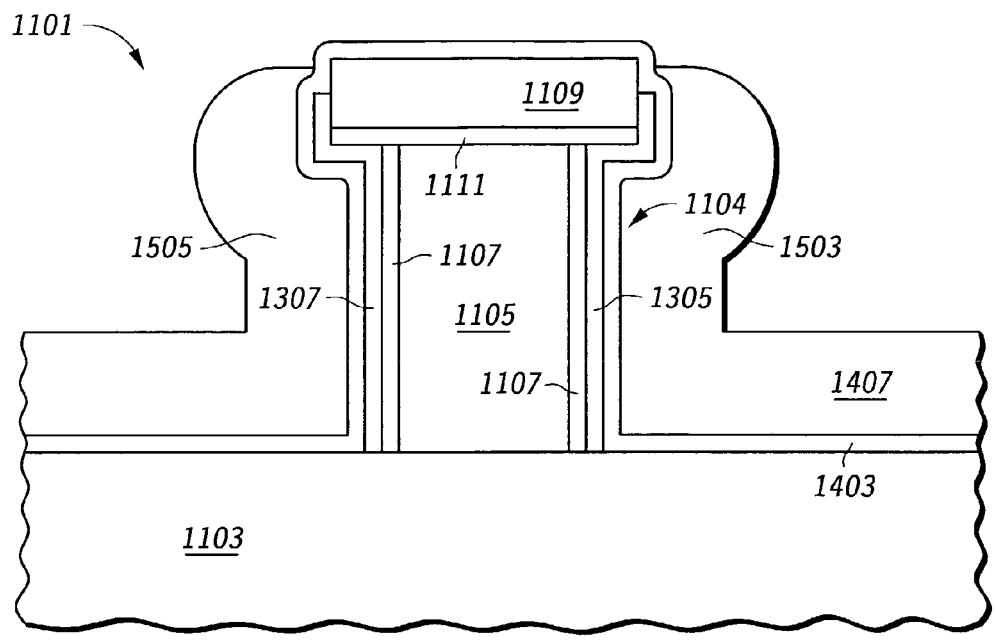
FIG. 15 is a partial side cross sectional view of another embodiment of a semiconductor wafer during another stage in the manufacture of a transistor according to the present invention.
Figure 16:
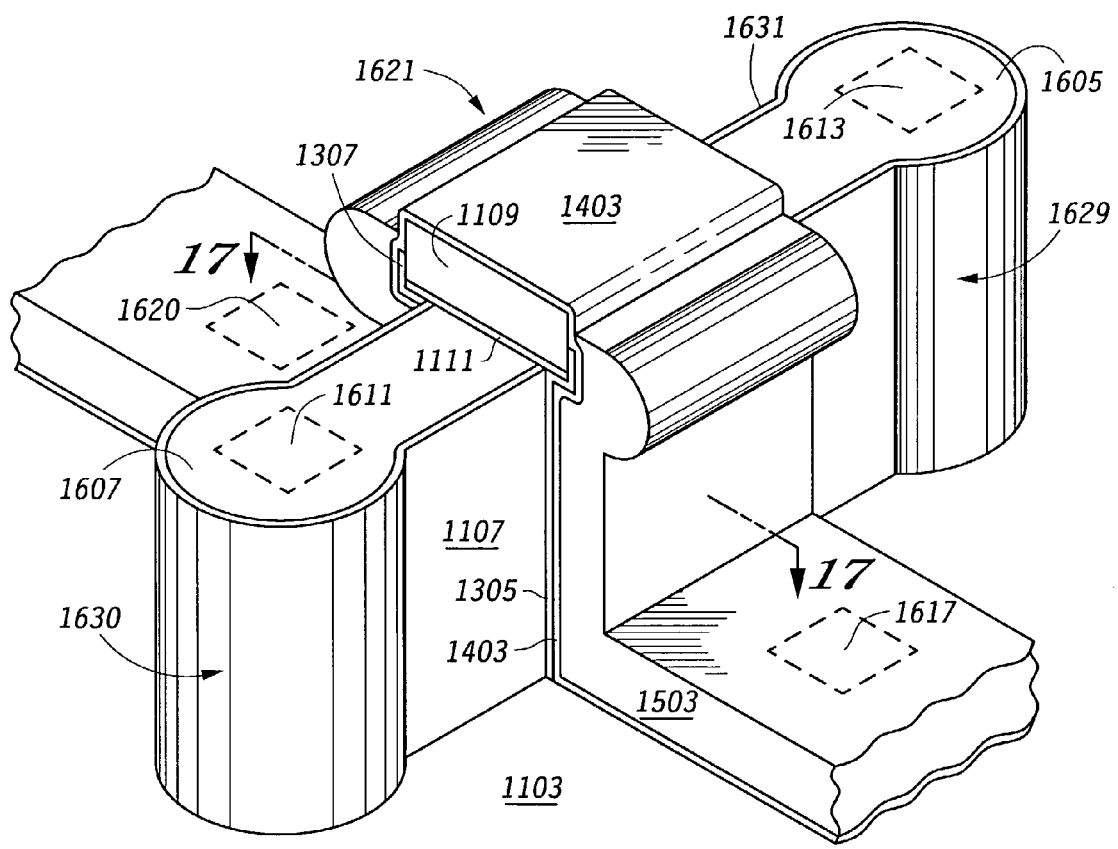
FIG. 16 is a partial isometric view of another embodiment of a semiconductor wafer during another stage in the manufacture of a transistor according to the present invention.

FIG. 15 shows a partial side view of wafer 1101 after the formation of gate structures 1505 and 1503. FIG. 16 is a partial isometric view of the transistor structure shown in FIG. 15. Regions 1607 and 1605 serve as current terminal regions with 1611 and 1613 serving as current terminal contacts (e.g. as source/drain contacts for FETs) for those regions. Also, regions 1620 and 1617 serve as gate contacts for gate structures, 1505 and 1503 respectively.

In some embodiments, gate structures 1503 and 1505 are doped. The material of these gate structures is doped, in one embodiment, prior to the deposition of the nitride layer (e.g. 205) over the layer of gate material. Also, in some embodiments, the current terminal regions 1607 and 1605 are doped after the formation of gate structures 1505 and 1503 to provide a conductivity type that is different from the conductivity type of the channel region of semiconductor structure portion 1105.

In later processing stages, silicide layers, spacers, gate vias, and current terminal vias and are formed over transistor structure 1621 by conventional semiconductor techniques. A low K dielectric material (e.g. 1009) may also deposited over the resultant transistor structure 1621. Other conventional processing stages not shown or described herein may be performed on wafer 1101 to form other conventional structures (such as e.g. interconnects and passivation layers) of an integrated circuit.

The resultant transistor structure 1621 shown in FIG. 16 can be utilized as a non volatile memory cell having four isolated charge storage locations (two each in charge storage structure 1305 and 1307, respectively) that can each store one of bit of data.

Figure 17:
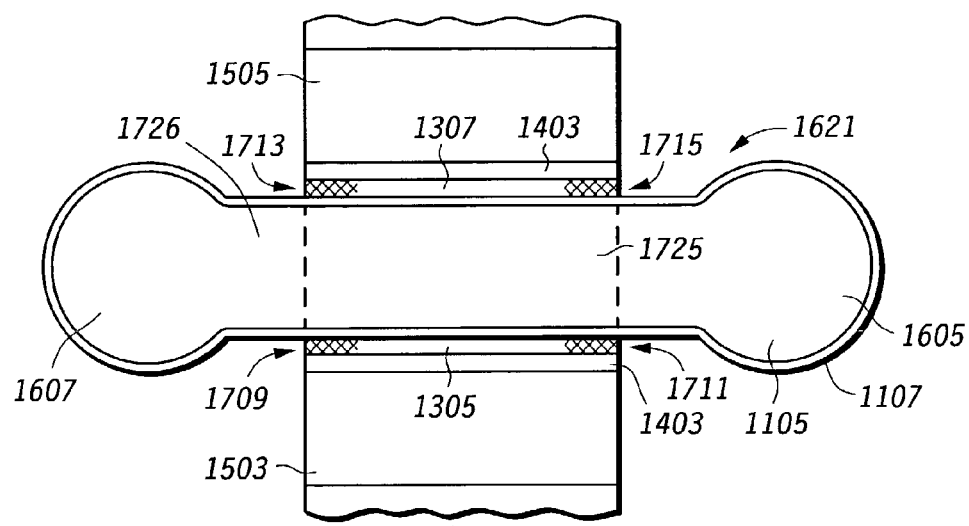
FIG. 17 is a partial cut away top view of another embodiment of a transistor according to the present invention.

FIG. 17 is a partial cutaway top view of transistor structure 1621 shown in FIG. 16. S Charge storage structure 1305 includes two charge storage locations 1709 and 1711, and charge structure 1307 includes two charge storage locations 1713 and 1715. These four charge storage locations may be programmed, read, and or erased by applying voltages to current terminal regions 1605 and 1607 and gate structures 1503 and 1505.

In one embodiment, the transistor structure 1621 functions as two functional MOSFET transistors that share source/drain regions and each have two charge storage-locations. Gate structure 1503 serves as the gate for one of the functional transistors, and gate structure 1505 serves as the gate of the other functional transistors. Charge storage locations 1709 and 1711 serve as charge storage locations for the functional transistor having gate structure 1503 as its gate. Charge storage locations 1713 and 1715 server as charge storage locations for the functional transistor having gate structure 1505 as its gate.

In the embodiment shown, semiconductor structure portion 1105 includes a channel region 1725 (approximately differentiated by the dashed lines) located between current terminal regions 1605 and 1607. Channel region 1725 is doped to provide a first conductivity type and current terminal regions 1605 and 1607 are doped to provide a second conductivity type.

During the operation of transistor structure 1621, when a voltage is applied to gate structure 1503 that exceeds a voltage threshold of the functional transistor associated with gate structure 1503, an inversion region forms along the sidewall of the channel region 1725 adjacent to gate structure 1503. When a voltage is applied to gate structure 1505 that exceeds a voltage threshold of the functional transistor associated with that gate structure, an inversion layer forms along the sidewall of channel region 1725 adjacent to gate structure 1505. In some embodiments where portion 1105 is relatively thin between gate structures 1503 and 1505, the regions where the inversion layers occur may overlap.

Charge may be injected into each of the charge storage locations (e.g. by hot carrier injection) to increase the threshold voltage of the functional transistor associated with that charge storage location. For example, to store a charge in charge storage location 1709, a positive voltage (Vpp) is applied to gate structure 1503, ½ Vpp is applied to current terminal region 1605, and a ground potential is applied to current terminal region 1607 and gate structure 1505.

Each of the charge storage locations may be read independently of each other. Application of a positive voltage (Vdd) to the gate structure adjacent to a charge storage location and a positive voltage (Vdd) to the current terminal on the opposite side of the charge storage location will effectively read the charge stored in the charge storage location without being affected by the charge stored in the other charge storage locations. For example, to read charge storage location 1709, a positive charge is applied to gate structure 1503 and to current terminal region 1607, with a ground potential (VSS) being applied to gate structure 1505 and current terminal region 1605. The voltage applied to current terminal region 1607 is sufficiently positive so that it effectively masks or shadows any charge present in charge storage location 1711. In this way, the current through the channel region is primarily affected by the charge stored in location 1709 and not by the charge stored in any other charge storage location.

To erase a charge stored in a charge storage location, a hot hole injection technique may be utilized. For example, to erase the charge stored in charge storage location 1709, a negative voltage (−Vpp) is applied to gate structure 1503 and a positive voltage (Vpp) is applied to current terminal region 1605, the current terminal adjacent to charge storage location 1709. A ground potential (Vss) is applied to current terminal region 1605 and gate structure 1505.

In another embodiment, the charge storage locations of structure 1621 may be erased at the same time by applying a negative voltage (−Vpp) to gate structures 1503 and 1505 and a positive voltage (Vpp) to current terminal regions 1605 and 1607.

In other embodiments, other program, read, and/or erase techniques may be utilized for programming, reading and/or erasing the charge in the charge storage location of transistor structure 1621. For example other conventional techniques for reading a non volatile memory cells having two storage locations may be used.

In other embodiments, transistor structure 1621 may be utilized such that it implements only two charge storage locations. In one such embodiment, the first charge storage location is located in charge storage structure 1305 and the second charge storage location is located in charge storage structure 1307. With these embodiments, transistor structure 1621 is utilized as two functional transistors with each functional transistor including a charge storage location. In one example of such an embodiment, the charge storage layer would be made of conducting material (e.g. polysilicon) e.g. as with a floating gate transistor.

In other embodiments having only two charge storage locations, each charge storage structure (1305 and 1307) would independently be able to store a charge, but transistor structure 1621 would be read as a single functional transistor having 4 voltage threshold levels. The voltage threshold would be a function of the charge stored in both the charge storage structures. In this embodiment, the charge storage structures would be programmed with different voltages applied to the gates structures. The transistor structure would be read with a single voltage applied to both gate structures.

In some of these embodiments, the gate structures would be preferably of different conductivity types or would have different work functions.

In other embodiments, a transistor structure having gate structures adjacent to the sidewalls of the channel region may have other configurations. For example, the width, length, and/or height of the channel region 1725 may be of other dimensions. Also in other embodiments, multiple transistor structures may be linked together wherein each transistor structure shares a current terminal region (e.g. 1607) with the adjacent transistor structure. The channel regions (e.g. 1725) and the gate structures (e.g. 1503 and 1505) would be located between the shared current terminal regions (e.g. 1607 and 1605). An example of such an implementation may be represented by the array shown in FIG. 18 wherein the current terminal region of one transistor structure is serves as the current terminal of another transistor structure. For example, referring to FIG. 16, a second intermediate structure (not shown) would extend from end structure 1630 in the opposite direction (to the left relative to the view shown in FIG. 17) as intermediate structure 1631 of structure 1104 extends from end structure 1630. A third intermediate structure (not shown) would extend from end structure 1629 in the opposite direction (to the right relative to the view shown in FIG. 17) as intermediate structure 1631 extends from end structure 1629. A pair of gate structures similar to gate structures 1503 and 1505 would be adjacent to each sidewall of the second intermediate structure and third intermediate structure, similar to the position of gate structures 1503 and 1505 with respect to intermediate structure 1631.

In other embodiments, the gate structures 1503 and 1505 may have different conductivity types. This may be accomplished in one embodiment by angled implantation of different dopant species. For example gate structure 1505 may be implanted with a P+ dopant and gate structure 1503 may be implanted with an N+ dopant.

Figure 18:
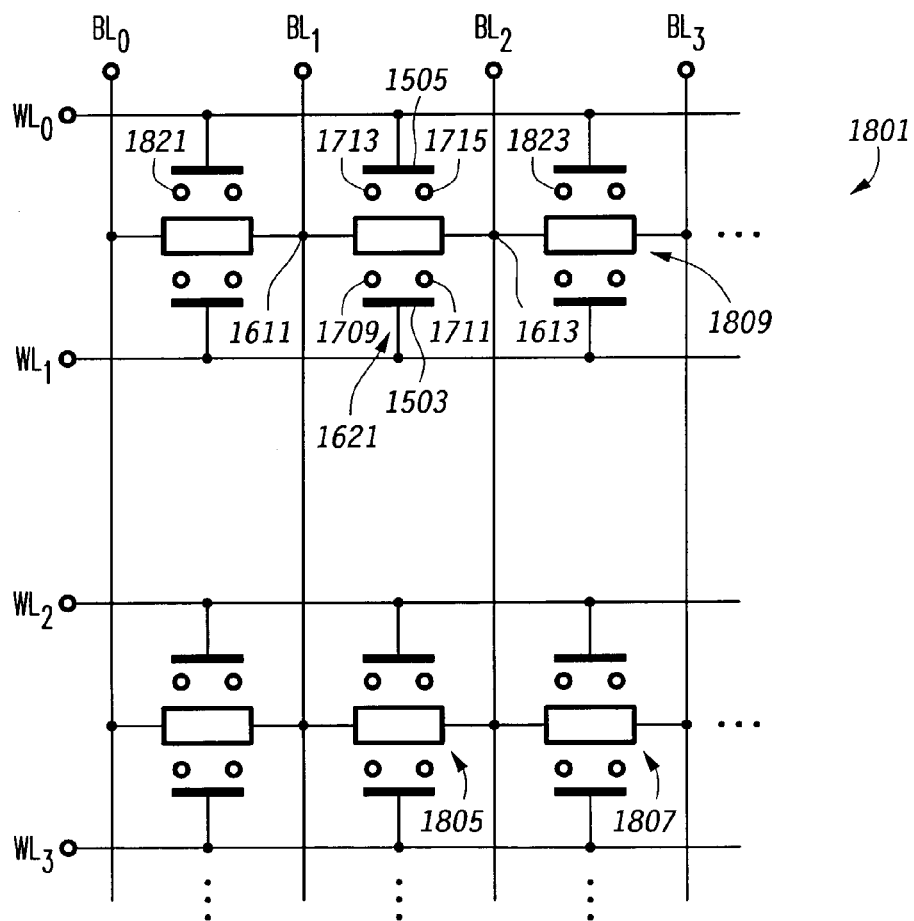
FIG. 18 is a schematic of one embodiment of a memory array according to the present invention.

FIG. 18 is a circuit diagram of a non volatile memory array implementing the transistor structure 1621 as a memory cell including four storage locations (1713, 1709, 1715, and 1711). In one embodiment, array 1801 is a non volatile memory array of an integrated circuit device. Array 1801 includes a number of memory cells with each cell (e.g. 1809, 1805, 1807) implementing a transistor structure similar to transistor structure 1621. Each cell includes four storage locations similar to storage locations 1713, 1709, 1715, and 1711.

The gate structures (e.g. 1505 and 1503) of each cell are coupled to a word line. For example, gate structure 1505 is couple to word line WL0 and gate structure 1503 is coupled to word line WL1. Each current terminal region of a memory cell is coupled to a bitline. For example, terminal contact 1611 of terminal region is coupled to bitline BL1 and current terminal contact 1613 is coupled to bitline BL2. The bitlines (BL0, BL1, BL2, and BL3) and the word lines (WL0, WL1, WL2, and WL3) of array 1801 are couple to conventional memory array control circuitry (not shown) for controlling the voltages of the lines. The memory cells, are arranged in array 1801 in rows and columns. In the embodiment shown, cells 1809 and the cell of transistor structure 1621 are in the same row, and cells, 1809 and 1807 are in the same column.

FIG. 19 sets forth the voltages applied to the bitlines and word lines shown in FIG. 18 for programming, erasing, and reading storage location 1713. In one embodiment, Vpp=8.0V, Vss=0, and Vdd=4.0. To read storage location 1713, BL1 is coupled to a sense amplifier (not shown), as designated by "SA" in the table of FIG. 19, to determine whether the transistor has been turned on or not. Whether a transistor has been turned on or not is dependent upon whether a charge is stored at the charge storage location (e.g. 1713) being read. To program location 1713, a voltage of VPP/2 is applied to bitline BL1 and all bitlines located before BL1 (e.g. BL0) so that locations having a gate coupled to word line WL0 located before bitline BL1 (e.g. charge storage location 1821) are not programmed. A ground voltage VSS is applied to all bitlines located after BL1 (e.g. BL2 and BL3) so that no charge storage locations located after bitline BL2 (e.g. 1823) are inadvertently programmed.

In other embodiments, the charge storage locations of array 1801 may be erased in a block erase function. In these embodiments, a positive voltage is applied to all bitlines and a negative voltage is applied to all word lines.

FIG. 20 sets forth voltages applied to the bitlines and word lines shown in FIG. 18 for programming, erasing, and reading storage location 1711.

As shown in the tables of FIGS. 19 and 20, the gate of a cell opposite of the charge storage location being programmed, erased, or read is biased at ground (VSS) during these operations. For example, gate structure 1503, which is opposite of charge storage location 1713, is biased at VSS during program, erase, and read operations of location 1713.

FIGS. 21 and 22 set forth voltages that are applied to the bitlines and word lines of array 1801 in another embodiment for programming, erasing, and reading the charge storage locations of 1801. In this embodiment, the opposing gate to the charge storage location of a cell being programmed is biased at the opposite voltage of the gate of the cell associated with that location. For example, referring to FIG. 21, to program location 1713, a positive voltage VPP is applied to the word line (WL0), which is coupled to gate structure 1505 and is associated with charge storage location 1713, and −VPP is applied to word line WL1, which is coupled gate structure 1503 and is opposite to charge storage location 1713. In this embodiment, the width and conductivity of the channel regions of the transistor structures are such that the potential of the channel region adjacent to a gate structure is influenced by the opposing gate structure.

Because a negative program voltage can be applied to the opposing gate of a charge storage location being programmed, the voltage applied to the gate associated with the cell being programmed may be reduced accordingly. For example, in one embodiment, VPP may be 6.0 volts. Accordingly, because this embodiment allows for a reduction in the program voltage, lower programming voltages may be utilized. In some embodiments, reducing the programming voltage may allow for a reduction in the area required for circuitry to provide the program voltage.

Another advantage that may occur from using a transistor with gate structures adjacent to opposing sidewalls in a memory array is that the opposite gate of a charge storage location can provide a transistor such as e.g. a FinFET with a voltage control circuit that effectively acts like as a well voltage control circuit for a planar CMOS transistor. However, unlike the well voltage control circuit for planar CMOS transistors, the voltage of the opposing gate can be controlled independently of gates in other rows of the array. This may allow for the use of more advanced program and erase techniques for an array than would be possible with other types of charge storage transistors.

One advantage that may occur with the array shown in FIG. 18 is that more charge storage locations may be implemented in a given area than with planar CMOS NVM cells. Furthermore, with the array of FIG. 18, because 4 independent storage locations are programmable utilizing just two current terminal contacts, the transistors may be more closely placed in an array. In some embodiments, a transistor structure similar to transistor structure 1621 may be easily implemented in an integrated circuit having devices implementing FinFET technology or other types of silicon on insulator technology.

In another embodiments, transistor structure 1261 may be modified to have only one charge storage structure between a gate and the sidewall of the channel region. With one embodiment of such a transistor, the opposing sidewall would not have a charge storage structure between it and the opposing gate. The opposing gate would serve as an effective well bias voltage control circuit.

Furthermore, transistor structures such as those describe above may be implemented in memory arrays having other configurations. Also in other embodiments, a memory cell having two independent gate structures adjacent to opposing sidewalls of a semiconductor structure and having charge storage locations located between the gate structures and the sidewalls maybe made by other semiconductor processes other than that set forth in this specification, including other conventional processes for forming independent gate structures.

In one aspect of the invention, a method of making a semiconductor device includes providing a substrate and a semiconductor structure over the substrate. The semiconductor structure has a first sidewall, a second sidewall, and a top surface. The method also includes depositing at least one substantially conformal layer over the substrate. The at least one substantially conformal layer includes at least a layer of gate material. The at least one substantially conformal layer has a top surface at a height over the semiconductor structure. The method further includes forming a substantially planar layer over the substrate below the height of the top surface of the at least one substantially conformal layer over the semiconductor structure and non-abrasive etching through the layer of gate material over the top surface of the semiconductor structure.

In another aspect of the invention, a method of making a semiconductor device includes providing a substrate and a semiconductor structure over the substrate. The semiconductor structure has a first sidewall, a second sidewall, and a top surface. The method also includes depositing a first substantially conformal layer of gate material over the substrate and over the semiconductor structure, depositing a second substantially conformal layer of a material over the first substantially conformal layer, and forming a substantially planar layer over the substrate after depositing the second substantially conformal layer. The method still further includes etching through the first substantially conformal layer over the top surface of the semiconductor structure, etching through the second substantially conformal layer over the top surface of the semiconductor structure, and forming a contact to a portion of the first substantially conformal layer.

In another aspect of the invention, a method of forming a semiconductor structure includes providing a substrate and forming a semiconductor fin on the substrate. The fin has a first and second sidewalls. The method also includes forming a layer of charge storage material over the substrate. The layer of charge storage material includes a first portion adjacent to the first sidewall of the fin and a second portion adjacent to the second sidewall of the fin. The method still further includes forming a layer of gate material over the substrate after the forming the layer of charge storage material. The layer of gate material includes a first portion adjacent to the first sidewall of the fin and a second portion adjacent the second sidewall of the fin. The method still further includes removing the layer of gate material over the semiconductor fin.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

The invention claimed is:

1. A method of making a semiconductor device, comprising:
    providing a substrate and a semiconductor structure over the substrate, the semiconductor structure having a first sidewall, a second sidewall, and a top surface;
    depositing at least one substantially conformal layer over the substrate, wherein the at least one substantially conformal layer comprises at least a layer of gate material,
        wherein the at least one substantially conformal layer has a top surface at a height over the semiconductor structure;
    forming a substantially planar layer over the substrate below the height of the top surface of the at least one substantially conformal layer over the semiconductor structure; and
    non-abrasive etching through the layer of gate material over the top surface of the semiconductor structure, wherein the non-abrasive etching further comprises non-abrasive etching through the layer of gate material over a channel region of the semiconductor structure, wherein the non-abrasive etching through the layer of gate material further comprises etching the layer of gate material to leave a first portion of gate material located adjacent to the first sidewall and a second portion of gate material located adjacent to the second sidewall;
    forming a first current terminal region in the semiconductor structure;
    forming a second current terminal region in the semiconductor structure;
    wherein a first gate of a first functional transistor includes material of the first portion of gate material, the first functional transistor has a first channel region between the first current terminal region and the second current terminal region, the first channel region including at least a portion of the semiconductor structure located alone the first sidewall adjacent to the first gate;
    wherein a second gate of a second functional transistor includes material of the second portion of gate material, the second functional transistor has a second channel region between the first current terminal region and the second current terminal region, the second channel region including at least a portion of the semiconductor structure located along the second sidewall adjacent to the second gate.

2. A method of making a semiconductor device, comprising:
    providing a substrate and a semiconductor structure over the substrate, the semiconductor structure having a first sidewall, a second sidewall, and a top surface;
    depositing at least one substantially conformal layer over the substrate, wherein the at least one substantially conformal layer comprises at least a layer of gate material, wherein the at least one substantially conformal layer has a top surface at a height over the semiconductor structure;

forming a substantially planar layer over the substrate below the height of the top surface of the at least one substantially conformal layer over the semiconductor structure; and non-abrasive etching through the layer of gate material over the top surface of the semiconductor structure;

patterning the at least one substantially conformal layer to form a gate structure prior to the forming the substantially planar layer over the substrate, wherein the non-abrasive etching through the layer of gate material over the top surface of the semiconductor structure further includes etching through the layer of gate material of the gate structure over the top surface of the semiconductor structure.

3. The method of claim 2, wherein the layer of gate material has a portion running generally parallel to a surface of the substrate, the method further comprising forming a contact on the portion of the layer of gate material running generally parallel to the surface of the substrate.

4. The method of claim 2, wherein forming the substantially planar layer comprises:

depositing material of the substantially planar layer to a height above the height of the top surface of the at least one substantially conformal layer; and etching back the material of the substantially planar layer to a height below the height of the top surface of the at least one substantially conformal layer to expose the top surface of the at least one substantially conformal layer over the top surface of the semiconductor structure.

5. The method of claim 2, wherein the forming the substantially planar layer comprises depositing material of the substantially planar layer over a surface of the semiconductor substrate to a height below the height of the top surface of the at least one substantially conformal layer.

6. The method of claim 2, wherein forming the substantially planar layer comprises spinning on material of the substantially planar layer.

7. The method of claim 2, wherein the substantially planar layer includes photo resist.

8. The method of claim 2, wherein the layer of gate material includes polysilicon.

9. The method of claim 2, wherein the layer of gate material includes a metal.

10. The method of claim 2, further comprising:

implanting dopants at a first angle relative to the substrate of a first type into the layer of gate material in an area adjacent to the first sidewall; and implanting dopants at a second angle relative to the substrate of a second type into the layer of gate material in an area adjacent to the second sidewall.

11. The method of claim 2 further comprising:

forming a first current terminal region in the semiconductor structure;

forming a second current terminal region in the semiconductor structure;

wherein a channel region is located in the semiconductor structure between the first current terminal region and the second current terminal region.

12. The method of claim 2 wherein:

a channel region of the semiconductor structure includes a region located along the first sidewall of the semiconductor structure;

wherein the non-abrasive etching through the layer of gate material over the top surface of the semiconductor structure leaves a structure adjacent to the region located along the first sidewall.

13. The method of claim 2 wherein the non-abrasive etching through the layer of gate material further comprises etching the layer of gate material to leave a first portion of gate material located adjacent to the first sidewall and a second portion of gate material located adjacent to the second sidewall, the method further comprising:

forming a first current terminal region in the semiconductor structure;

forming a second current terminal region in the semiconductor structure;

wherein a first gate of a first functional transistor includes material of the first portion of gate material, the first functional transistor has a first channel region between the first current terminal region and the second current terminal region, the first channel region including at least a portion of the semiconductor structure located along the first sidewall adjacent to the first gate;

wherein a second gate of a second functional transistor includes material of the second portion of gate material, the second functional transistor has a second channel region between the first current terminal region and the second current terminal region, the second channel region including at least a portion of the semiconductor structure located along the second sidewall adjacent to the second gate.

14. The method of claim 2, further comprising:

doping a current terminal region of the semiconductor structure after the step of patterning and prior to the step of non-abrasive etching.

15. The method of claim 2 wherein the semiconductor structure is characterized as a semiconductor fin.

16. The method of claim 2, wherein the at least one substantially conformal layer further comprises a nitride layer over the layer of gate material.

17. The method of claim 16 further comprising:

etching through the nitride layer over the top surface of the semiconductor structure prior to the non-abrasive etching through the layer of gate material.

18. The method of claim 2 further comprising:

providing a dielectric structure over the top surface of the semiconductor structure, the dielectric structure having a top surface, wherein the at least one substantially conformal layer is deposited over the dielectric structure, wherein the non-abrasive etching through the layer of gate material further includes etching through the layer of gate material over the top surface of the dielectric structure.

19. The method of claim 18 wherein the non-abrasive etching through the layer of gate material further comprises etching the layer of gate material to leave a first portion of gate material located adjacent to the first sidewall and a second portion of gate material located adjacent to the second sidewall, wherein the first and second portions of gate material each have a top surface at height above a height of the top surface of the semiconductor structure and below a height of the top surface of the dielectric structure.

20. The method of claim 2 further comprising forming a dielectric layer on the semiconductor structure prior to forming the at least one substantially conformal layer.

21. The method of claim 20 further comprising:

forming a layer of charge storage material over the semiconductor structure prior to the forming the at least one substantially conformal layer, the layer of charge storage material including a first portion located adjacent to the first sidewall and a second portion located adjacent to the second sidewall.

22. The method of claim 21, wherein the layer of charge storage material includes at least one of polysilicon and silicon nitride for storing charge.

23. A method of makina a semiconductor device, comprising:
   providing a substrate and a semiconductor structure over the substrate, the semiconductor structure having a first sidewall, a second sidewall, and a top surface;
   depositing at least one substantially conformal layer over the substrate, wherein the at least one substantially conformal layer comprises at least a layer of gate material, wherein the at least one substantially conformal layer has a top surface at a height over the semiconductor structure;
   forming a substantially planar layer over the substrate below the height of the ton surface of the at least one substantially conformal layer over the semiconductor structure;
   non-abrasive etching through the layer of gate material over the top surface of the semiconductor structure, wherein the non-abrasive etching further comprises non-abrasive etching through the layer of gate material over a channel region of the semiconductor structure;
   forming a dielectric layer on the semiconductor structure prior to forming the at least one substantially conformal layer;
   forming a layer of charge storage material over the semiconductor structure prior to the forming the at least one substantially conformal layer, the layer of charge storage material including a first portion located adjacent to the first sidewall and a second portion located adjacent to the second sidewall;
   wherein the layer of charge storage material includes nanocrystals for storing charge.

24. Method of making a semiconductor device, comprising:
   providing a substrate and a semiconductor structure over the substrate, the semiconductor structure having a first sidewall, a second sidewall, and a top surface;
   depositing at least one substantially conformal layer over the substrate, wherein the at least one substantially conformal layer comprises at least a layer of gate material,
      wherein the at least one substantially conformal layer has a top surface at a height over the semiconductor structure;
   forming a substantially planar layer over the substrate below the height of the top surface of the at least one substantially conformal layer over the semiconductor structure; and
   non-abrasive etching through the layer of gate material over the top surface of the semiconductor structure;
   wherein the at least one conformal layer includes a second substantially conformal layer formed after the layer of gate material, the second substantially conformal material is for use as an etch stop layer.

25. A method of making a semiconductor device, comprising:
   providing a substrate and a semiconductor structure over the substrate, the semiconductor structure having a first sidewall, a second sidewall, and a top surface;
   depositing a first substantially conformal layer of gate material over the substrate and over the semiconductor structure;
   depositing a second substantially conformal layer of a material over the first substantially conformal layer,
   forming a substantially planar layer over the substrate after depositing the second substantially conformal layer;
   etching through the first substantially conformal layer over the top surface of the semiconductor structure;
   etching through the second substantially conformal layer over the top surface of the semiconductor structure; and
   forming a contact to a portion of the first substantially conformal layer.

26. The method of claim 25, wherein the substantially planar layer is a spin-on material.

27. The method of claim 25, further comprising removing portions of the first substantially conformal layer over a current terminal portion of the semiconductor structure prior to depositing the substantially planar layer.

28. The method of claim 25, wherein the forming the substantially planar layer comprises depositing material of the substantially planar layer to a height lower than a height of a top surface of the second substantially conformal layer over the top surface of the semiconductor structure.

29. The method of claim 25, further comprising etching back the substantially planar layer to lower the substantially planar layer below a height of a top surface of the second substantially conformal layer over the semiconductor structure prior to etching through the first substantially conformal layer.

30. The method of claim 25, wherein the etching through the first substantially conformal layer results in a first portion of the first substantially conformal layer adjacent to the first sidewall of the semiconductor structure and extending over a first portion of the substrate and a second portion of the first substantially conformal layer adjacent to the second sidewall of the semiconductor structure and extending over a second portion of the substrate, wherein the first and second portions are electrically isolated from each other.

31. The method of claim 30, wherein forming the contact comprises forming the contact to the first portion of the first substantially conformal layer over the first portion of the substrate.

32. The method of claim 22, further comprising forming a second contact to the second portion of the first substantially conformal layer over the second portion of the substrate.

33. The method of claim 25, further comprising:
   forming a layer of charge storage material over the substrate and over the semiconductor structure prior to the forming the first substantially conformal layer, the layer of charge storage material including a first portion located adjacent to the first sidewall and a second portion located adjacent to the second sidewall.

34. The method of claim 33, wherein the layer of charge storage material includes at least one of silicon nitride and polysilicon for storing charge.

35. The method of claim 33, wherein the layer of charge storage material includes nanocrystals for storing charge.

36. The method of claim 25, further comprising removing the substantially planar layer after the etching through the first substantially conformal layer and the etching through the second substantially conformal layer.

37. The method of claim 36, further comprising removing the second substantially conformal layer after the etching through the first substantially conformal layer and the etching through the second substantially conformal layer.

38. A method of forming a semiconductor structure, comprising:

providing a substrate;

forming a semiconductor structure on the substrate, the semiconductor structure has a first and second sidewalls;

forming a layer of charge storage material over the substrate, the layer of charge storage material including a first portion adjacent to the first sidewall of the semiconductor structure and a second portion adjacent to the second sidewall of the semiconductor structure;

forming a layer of gate material over the substrate after the forming the layer of charge storage material, the layer of gate material including a first portion adjacent to the first sidewall of the semiconductor structure and a second portion adjacent the second sidewall of the semiconductor structure;

removing the layer of gate material over the semiconductor structure fin;

forming a first current terminal region in the semiconductor structure;

forming a second current terminal region in the semiconductor structure;

wherein a channel region is located in the semiconductor structure between the first current terminal region and the second current terminal region.

39. The method of claim 38 wherein the semiconductor structure is characterized as a semiconductor fin.

* * * * *

UNITED STATES PATENT AND TRADEMARK OFFICE
CERTIFICATE OF CORRECTION

PATENT NO. : 7,192,876 B2 Page 1 of 1
APPLICATION NO. : 10/443375
DATED : March 20, 2007
INVENTOR(S) : Leo Mathew et al.

It is certified that error appears in the above-identified patent and that said Letters Patent is hereby corrected as shown below:

In Column 15, Line 19, Claim No. 23:
    Change "ton" to --top--.
In Column 15, Line 38, Claim No. 24:
    Change "Method" to --A method--.

Signed and Sealed this

Sixth Day of November, 2007

JON W. DUDAS
*Director of the United States Patent and Trademark Office*